United States Patent
Agarwal et al.

(10) Patent No.: US 10,123,114 B2
(45) Date of Patent: Nov. 6, 2018

(54) BROWNOUT RESPONSE

(71) Applicant: TEXAS INSTRUMENTS INCORPORATED, Dallas, TX (US)

(72) Inventors: Uttam Kumar Agarwal, Bangalore (IN); Prateek Jain, Chandigarh (IN); Nageswara Rao, Bangalore (IN); Mukund Navada, Bangalore (IN); Pradeep Chandar Chandramouli, Tamil Nadu (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/643,614

(22) Filed: Jul. 7, 2017

(65) Prior Publication Data

US 2018/0014122 A1    Jan. 11, 2018

(30) Foreign Application Priority Data

Jul. 9, 2016    (IN) .............................. 201641023535

(51) Int. Cl.
| | |
|---|---|
| H03G 11/00 | (2006.01) |
| H04R 3/00 | (2006.01) |
| H03F 3/217 | (2006.01) |
| H03F 3/183 | (2006.01) |
| H03G 7/00 | (2006.01) |
| H04R 29/00 | (2006.01) |
| H03G 3/00 | (2006.01) |
| H03G 3/30 | (2006.01) |

(52) U.S. Cl.
CPC .............. *H04R 3/007* (2013.01); *H03F 3/183* (2013.01); *H03F 3/217* (2013.01); *H03G 3/007* (2013.01); *H03G 3/3005* (2013.01); *H03G 7/002* (2013.01); *H04R 29/001* (2013.01); *H03F 2200/03* (2013.01); *H04R 2420/05* (2013.01); *H04R 2430/01* (2013.01)

(58) Field of Classification Search
USPC ........ 381/55, 56, 58, 86, 104, 120, 121, 314
See application file for complete search history.

(56) References Cited

U.S. PATENT DOCUMENTS

| | | | |
|---|---|---|---|
| 2012/0177226 A1* | 7/2012 | Silverstein | G06F 1/3212 381/107 |
| 2014/0270242 A1* | 9/2014 | Cheung | H03F 3/68 381/86 |

* cited by examiner

*Primary Examiner* — Yosef K Laekemariam
(74) *Attorney, Agent, or Firm* — John R. Pessetto; Charles A. Brill; Frank D. Cimino

(57) ABSTRACT

Brownout management for an audio amplification system. An audio amplification system includes audio volume control circuitry, audio sample interpolation circuitry, and brownout management circuitry. The brownout management circuitry includes brownout detection circuitry and brownout response circuitry. The brownout detection circuitry is configured to determine whether a voltage of a battery that powers the audio amplification system is below a brownout threshold, and to generate a brownout detection signal that indicates the voltage is below the brownout threshold. The brownout response circuitry is coupled to an audio output of the audio sample interpolation circuitry. The brownout response circuitry is configured to attenuate the audio samples output by the audio sample interpolation circuitry responsive to the brownout detection signal indicating that the voltage is below the brownout threshold.

11 Claims, 2 Drawing Sheets

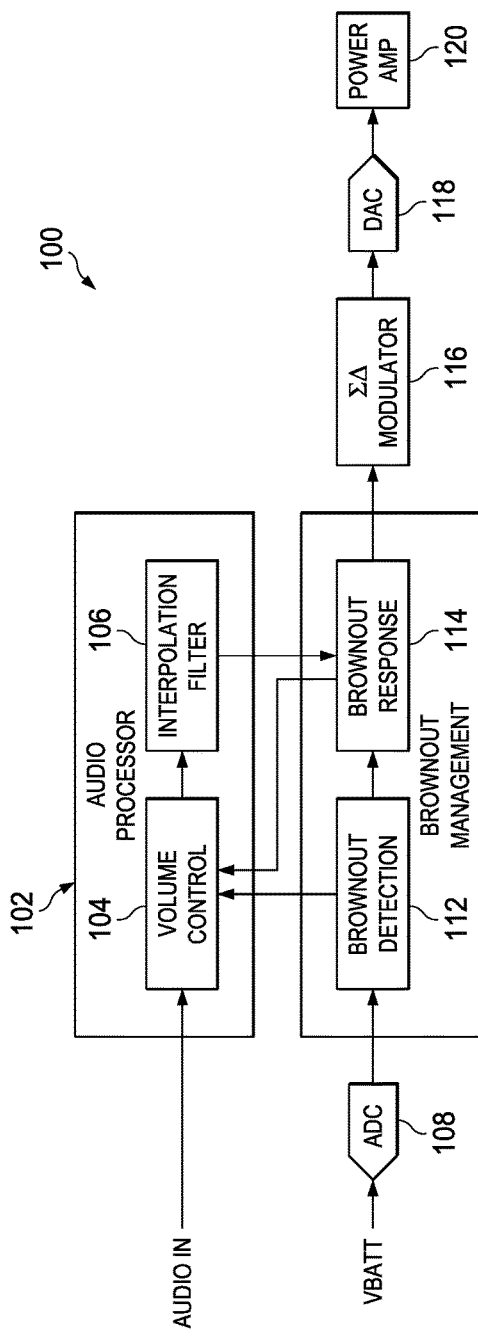
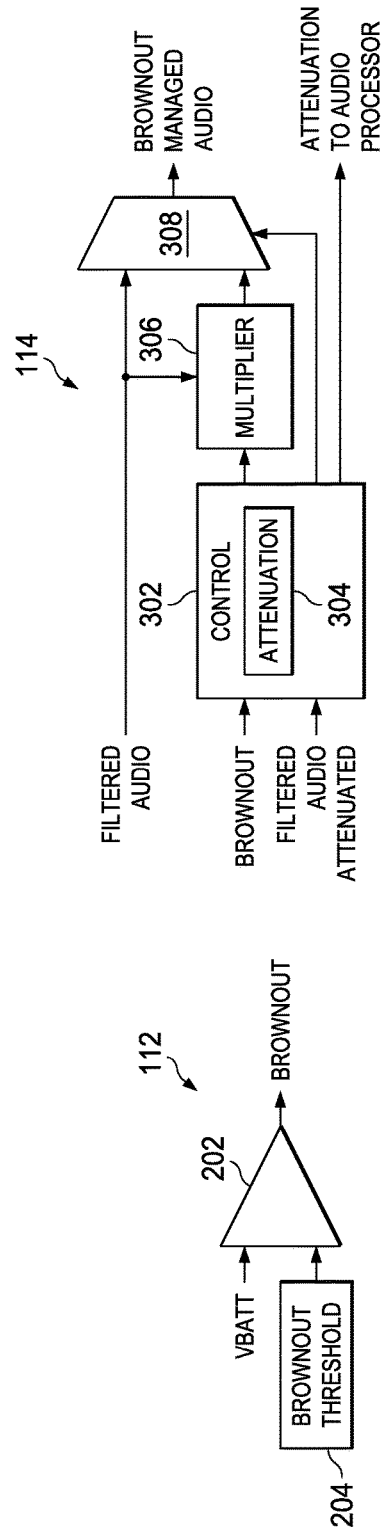

BROWNOUT RESPONSE

CROSS-REFERENCE TO RELATED APPLICATIONS

The present application claims priority to Indian Provisional Patent Application No. 201641023535, filed Jul. 9, 2016, titled "Low Latency Response to Brownout By Using Distributed Architecture," which is hereby incorporated herein by reference in its entirety.

BACKGROUND

Brownout events are well known in the art of electronics and pertain to conditions in which the voltage supplied to a particular electronic device or system falls below the minimum operating voltage required by the given device or system. During a brown out event, when the supply voltage falls below the minimum operating voltage allowable for the particular device, the device may malfunction or lose functionality. To mitigate the effects of brownout, electronic systems may include circuitry to detect brownout events, adjust the operation of the system to accommodate a reduced power supply voltage, and resume normal operation when the power supply voltage increases to a level above the minimum operating voltage.

SUMMARY

Brownout management for an audio amplification system is disclosed herein. In one embodiment, an audio amplification system includes audio volume control circuitry, audio sample interpolation circuitry, and brownout management circuitry. The brownout management circuitry includes brownout detection circuitry and brownout response circuitry. The brownout detection circuitry is configured to determine whether the voltage of a battery that powers the audio amplification system is below a brownout threshold, and to generate a brownout detection signal that indicates the voltage is below the brownout threshold. The brownout response circuitry is coupled to an audio output of the audio sample interpolation circuitry. The brownout response circuitry is configured to attenuate the audio samples output by the audio sample interpolation circuitry responsive to the brownout detection signal indicating that the voltage is below the brownout threshold.

In another embodiment, a brownout mitigation system includes brownout management circuitry. The brownout management circuitry includes power monitoring circuitry and brownout response circuitry. The power monitoring circuitry is configured to determine whether the voltage provided by a power source is below a brownout threshold, and to generate a brownout detection signal that indicates the voltage is below the brownout threshold. The brownout response circuitry is configured to receive an output of a digital filter, and to attenuate the signal samples output by the digital filter responsive to the brownout detection signal indicating that the voltage is below the brownout threshold.

In a further embodiment, an audio processing system includes a processor and brownout management circuitry. The processor is configured to control magnitude of audio samples and apply a digital filter to the audio samples. The brownout management circuitry includes brownout detection circuitry and brownout response circuitry. The brownout detection circuitry is configured to determine whether the voltage of a power source that powers the audio processing system is below a brownout threshold, and to generate a brownout detection signal that indicates the voltage is below the brownout threshold. The brownout response circuitry is coupled to an audio output of the processor. The brownout response circuitry is configured to attenuate the audio samples output by the processor responsive to the brownout detection signal indicating that the voltage is below the brownout threshold.

BRIEF DESCRIPTION OF THE DRAWINGS

For a detailed description of various examples, reference will now be made to the accompanying drawings in which:

FIG. 1 shows a block diagram of an audio amplification system that includes brownout management in accordance with various embodiments;

FIG. 2 shows a block diagram of a brownout detection circuit in accordance with various embodiments;

FIG. 3 shows a block diagram of a brownout response circuit in accordance with various embodiments.

DETAILED DESCRIPTION

Figure 4:
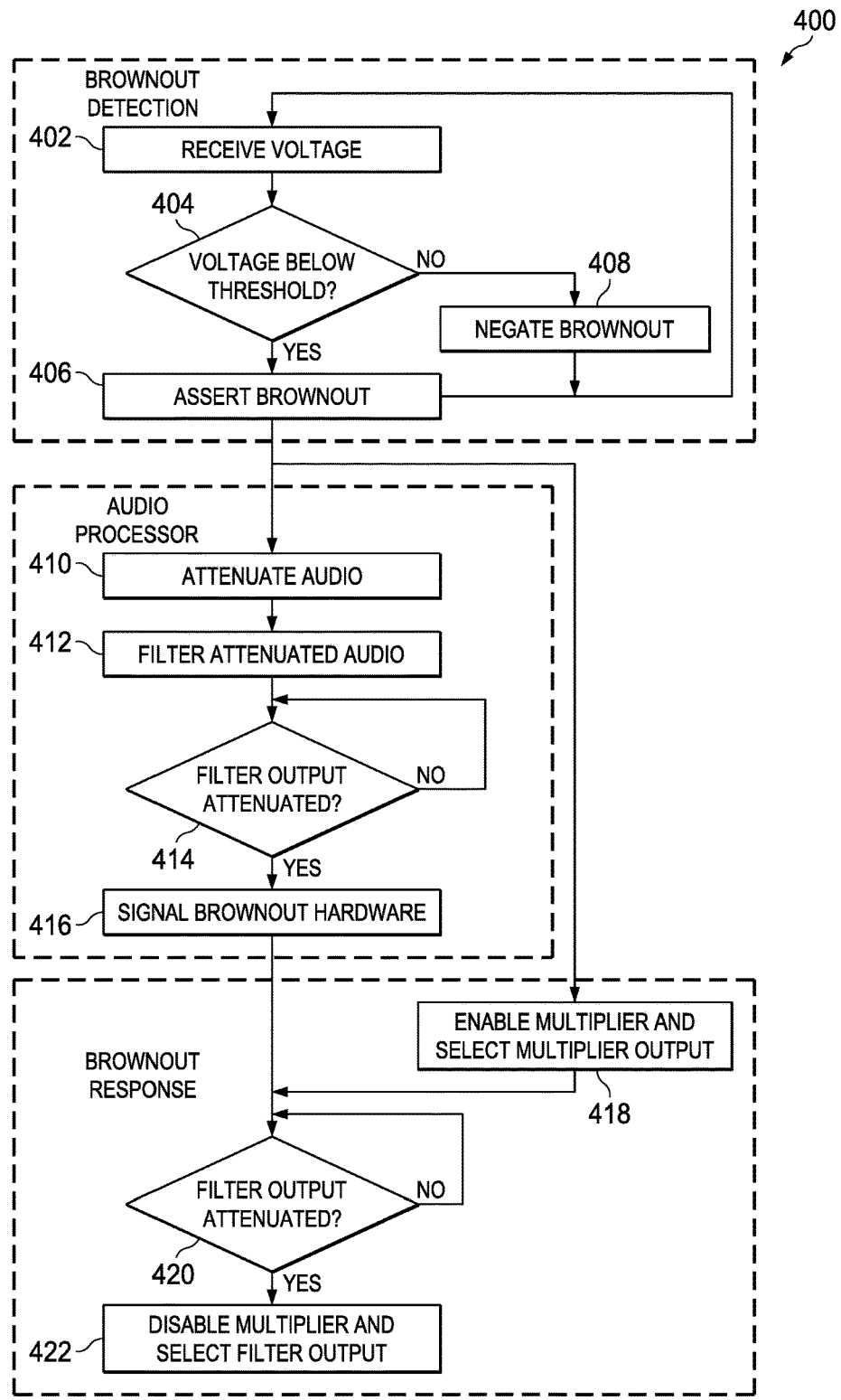
FIG. 4 shows a flow diagram for a method for managing brownouts in an audio amplification system in accordance with various embodiments.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

In some smart audio amplifiers, a digital signal processor (DSP) provides volume control and interpolates the audio signal before the audio data is converted to an analog signal provided to a class D amplifier. The DSP detects brownout and triggers a reduction in audio volume that may take 100 microseconds (us) or more to reach the audio power amplifier, due to filtering and buffering of audio data in the DSP (e.g., 140 us filter latency+20 us buffering latency+20 us brownout detection latency). In practice, once the power supply voltage falls below a predetermined brownout value, audio signal should to be attenuated in less than 10 us to reduce the loading on the power supply. The brownout management techniques disclosed herein provide improved brownout event management by including brownout detection and initial attenuation of audio signals in circuitry external to the DSP. After the DSP has had time to respond to the brownout, the external brownout response circuitry relinquishes audio signal attenuation to the DSP. Embodiments of the audio circuitry disclosed herein can provide attenuation of audio signal in less than 10 us from occurrence of a brownout.

FIG. 1 shows a block diagram of an audio amplification system 100 that includes brownout management in accordance with various embodiments. The system 100 may also be referred to as an audio processing system or audio processing circuitry and includes an audio processor 102, brownout management circuitry 110, an analog-to-digital converter (ADC) 108, a sigma-delta (ΣΔ) modulator 116, a digital-to-analog converter (DAC) 118, and a power amplifier 120. The ADC 108 is coupled to the output of a battery or batteries that power the system 100, and digitizes the output voltage provided by the battery. The brownout management circuitry 110 is coupled to the ADC 108.

The brownout management circuitry 110 is separate from the audio processor 102, and may be implemented as dedicated hardware circuits dedicated to the functionality disclosed herein. The brownout management circuitry 110 includes brownout detection circuitry 112 and brownout response circuitry 114. The brownout detection circuitry 112 determines whether a brownout event is occurring. The brownout detection circuitry 112 may also be referred to as power monitoring circuitry. The brownout detection circuitry 112 receives samples of the digitized battery voltage from the ADC 108 and compares the samples to a brownout threshold value. If the digitized battery voltage is less than the brownout threshold value, then the brownout detection circuitry 112 asserts a brownout detection signal that indicates the presence of a brownout. FIG. 2 shows a block diagram of the brownout detection circuitry 112 in accordance with various embodiments. The brownout detection circuitry 112 includes a comparator 202. The comparator 202 is a digital comparator that compares values of the digitized battery voltage to the brownout threshold value 204. The brownout threshold value 204 may be stored in a register or other storage structure of the brownout detection circuitry 112. The output of the comparator 202 is a brownout detection signal that indicates whether the voltage of the battery has fallen below the brownout threshold value 204. The brownout detection circuitry 112 is coupled to the brownout response circuitry 114 and to the audio processor 102.

The audio processor 102 is an instruction execution device that processes a digitized audio signal and provided the processed audio signal to drive a loudspeaker. In some embodiments, the audio processor 102 may be implemented as a DSP and instructions that are executed by the DSP to perform the operations disclosed herein. The audio processor 102 includes volume control 104 and interpolation filter 106. The volume control 104 and the interpolation filter 106 implemented by the audio processor may be referred to as volume control circuitry and audio sample interpolation circuitry. The volume control 104 may increase or decrease the magnitude of an audio signal (i.e., audio samples) based, for example, on audio volume parameters provided to the volume control 104. The volume control 104 receives the brownout detection signal generated by the brownout detection circuit 112, and responsive to the receipt of the brownout detection signal attenuates the audio samples. Unfortunately, due the latencies of buffering and delay in the interpolation filter 106, the attenuated audio samples generated by the volume control 104 may not be presented at the output of the audio processor 102 for some time (e.g., over 100 us).

The interpolation filter 106 is a digital filter that receives the audio samples generated by the volume control 104 and applies interpolation to the samples to increase the apparent sampling rate of the audio signal. Some embodiments of the interpolation filter 106 may include a finite impulse response filter or an infinite impulse response filter that induces substantially latency in the audio samples processed by the interpolation filter 106.

To provide flexibility in the processing of audio data during a brownout event, the audio processor 102 can determine when audio samples attenuated by the volume control 104 have propagated through the interpolation filter 104 to the brownout response circuitry 114. The audio processor 102 may make such a determination based, for example, on time elapsed or audio samples processed since receipt of the asserted brownout detection signal.

The brownout response circuitry 114 provides quick attenuation of audio data when a brownout event is detected by the brownout detection circuitry 112, thereby avoiding the latency induced by the audio processor 102. The brownout response circuitry 114 receives audio samples from the audio processor 106 and receives the brownout detection signal from the brownout detection circuitry 112. When the brownout detection signal indicates that a brownout event is in progress, the brownout response circuitry 114 immediately attenuates the audio samples receives received from the audio processor 102. Accordingly, attenuated audio samples are output by the brownout management circuitry 110 with much lower delay than can be provided by attenuating the audio samples in the audio processor 102.

FIG. 3 shows a block diagram of the brownout response circuitry 114 in accordance with various embodiments. The brownout response circuitry 114 includes a multiplexer or selector 308, a multiplier 306, and control circuitry 302. The selector 308 selects the output of the brownout response circuitry 114 to be either the filtered digital audio stream received from the audio processor 102 or the audio stream output by the multiplier 306, where the audio stream output by the multiplier 306 is an attenuated version of the filtered digital audio stream received from the audio processor 102.

The control circuit 302 manages the operation of the multiplier 306 and the selector 308. The control circuit 302 includes an attenuation value 304 that is provided to the multiplier 306 for multiplication with the digital audio stream received from the audio processor 102. The attenuation value 304 controls the amount of attenuation applied to the digital audio stream received from the audio processor 102 responsive to a brownout event.

When the brownout detection signal indicates that a brownout event is occurring, the control circuit 302 enables the multiplier 306 to multiply the digital audio stream received from the audio processor 102 by the attenuation value 304, thereby attenuating the filtered digital audio stream received from the audio processor 102. Responsive to detection of a brownout event, the control circuit 302 also enables the selector 308 to route the output of the multiplier 306 to the output of the brownout response circuitry 114, thereby providing the attenuated audio stream to circuitry downstream of the brownout management circuitry 110.

The control circuit 302 also provides handshaking with the processor 302 to coordinate signal attenuation. On receipt of a brownout detection signal indicating that a brownout event is occurring, the control circuit 302 may notify the audio processor 102 of the amount of attenuation to be applied to the filtered digital audio stream received from the audio processor 102. For example, the control circuit 302 may communicate the attenuation value 304, or the equivalent thereof, to the audio processor 102. The volume control 104 may attenuate the signal provided to the interpolation filter 106 based on the value of attenuation received from the control circuit 302. The control circuit 302 receives from the audio processor 102 a signal (FILTERED AUDIO ATTENUATED in FIG. 3) indicating that the audio processor 102 has attenuated, responsive to detection of the brownout event, the digital audio stream received by the brownout response circuitry 114. Responsive to receipt of the FILTERED AUDIO ATTENUATED signal, the control circuit 302 may cause the selector 308 to route the filtered digital audio stream received from the audio processor 102 to the output of the brownout response circuitry 114, and disable the multiplier 306, thereby returning control of audio signal attenuation to the audio processor 102 for the duration of the brownout event.

Digital audio output by the brownout response circuit 114 is converted to an analog signal and the analog signal is provided to a power amplifier for driving a loudspeaker. In some embodiments of the audio amplification system 100, the digital audio output by the brownout response circuit 114 is provided to the ΣΔ modulator 116 for conversion to a higher frequency ΣΔ bit stream, and the DAC 118 converts the output of the ΣΔ modulator 116 to an analog signal that is amplified by a power amplifier 120. In some embodiments, the power amplifier 120 may be a class-D amplifier. Some embodiments of the audio amplification system 100 may apply different DAC and/or power amplifier technologies.

FIG. 4 shows a flow diagram for a method 400 for managing brownouts in an audio amplification system in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 400 can be performed by the circuitry disclosed herein.

In block 402, the audio amplification system 100 is operating. The ADC 108 is digitizing the voltage of the battery powering the system 100, and the brownout detection circuitry 112 is receiving digitized samples of battery voltage.

In block 404, the brownout detection circuitry 112 compares the digitized samples of battery voltage to a brownout threshold value. If the brownout threshold value exceeds the value of the samples of battery voltage, then in block 406 the brownout detection circuitry 112 asserts the brownout detected signal. If the brownout threshold value does not exceed the value of the samples of battery voltage, then in block 408 the brownout detection circuitry 112 negates the brownout detected signal.

In block 410, the audio processor 102 receives the asserted brownout detection signal. Responsive to assertion of the brownout detection signal, the volume control 104 applies attenuation to the audio samples being processed. The amount of attenuation may be predetermined to reduce the amplitude of audio signal presented to the power amplifier 120 so that the power amplifier 120 draws a sufficiently small amount of power from the battery to prevent system failure. In some embodiments, the audio processor 102 may receive a value of attenuation from the brownout response circuitry 114, as described with respect to block 418, and apply the received value of attenuation, or a value derived therefrom, to attenuate the audio samples. In cases where the brownout detection signal is deasserted or negated, volume control circuitry 104 may pass the audio samples through to interpolation filter 106 without attenuating the samples, or pass the audio sample through to interpolation filter 106 with a level of attenuation that is less than the level of attenuation used when brownout detection signal is asserted.

In block 412, the audio samples produced by the volume control 104 are provided to the interpolation filter 106, and the interpolation filter 106 processes the attenuated audio samples to increase sample rate.

Propagation of the attenuated audio samples through the interpolation filter 106 and other features of the audio processor 102 may take substantial time. In block 414, the audio processor 102 determines whether the attenuated audio samples generated by the volume control 104 in response to assertion of the brownout detection signal have propagated through the interpolation filter 106. That is, the audio processor 102 determines whether the output of the interpolation filter 106 has been attenuated. The audio processor 102 may make the determination, for example, as a function of time elapsed or audio samples processed since receipt of the asserted brownout detection signal. Audio processor 102 may include circuitry to track the time or the number of audio samples processed since the assertion of the brownout detection signal.

If, in block 414, the audio processor determines that the output of the interpolation filter 106 has been attenuated, then, in block 416, the audio processor 102 provides a signal to the brownout management circuitry 110 indicating that audio samples received by the brownout management circuitry 110 have been attenuated. In some examples, audio processor 102 may assert the signal indicating that the audio samples have been attenuated in response to the elapsed amount of time or the number of audio samples processed since assertion of the brownout detection being greater than a threshold.

In block 418, the brownout response circuitry 114 receives the asserted brownout detection signal. Responsive to assertion of the brownout detection signal, the brownout response circuitry 114 applies attenuation to the audio samples being processed. The amount of attenuation applied may be preselected to reduce the power drawn from the batteries by the loudspeaker drive signals produced by the power amplifier 120 to a degree that ensures system operation during the brownout. To implement the attenuation, the brownout response circuitry 114 enables the multiplier 306 to multiply audio samples received from the audio processor 102 by the attenuation value 304, and selects the output of the multiplier 306 to be routed to downstream audio processing (e.g., the power amplifier 120). Responsive to assertion of the brownout detection signal, the brownout response circuitry 114 may also notify the audio processor 102 of the amount of attenuation to be applied to the filtered digital audio stream received from the audio processor 102. For example, the control circuit 302 may communicate the attenuation value 302, or the equivalent thereof, to the audio processor 102.

In block 420, the audio signal provided to the power amplifier 120 is being attenuated by the brownout response circuitry 114. While attenuating the audio samples received from the audio processor 102, the brownout response circuitry 114 determines whether the audio samples received from the audio processor 102 have been attenuated by the audio processor 102 responsive to assertion of the brownout detection signal. That is, the brownout response circuitry 114 determines whether the signal generated by the audio processor 102 in block 416 indicates that the audio samples received by the brownout response circuitry 110 have been attenuated by the audio processor 102.

If, in block 420, the brownout response circuitry 114 determines that the audio samples received by the brownout response circuitry 110 have been attenuated by the audio processor 102, then, in block 422, the brownout response circuitry 114 selects the attenuated audio samples received from the audio processor 102, rather than the output of the multiplier 306, to be routed to downstream audio processing (e.g., the power amplifier 120), and disables the multiplier 306 to suspend attenuation operations in the brownout response circuitry 114.

In some examples, brownout response circuitry 114 may enable multiplier 306 (and the attenuation of the filtered audio signal) in response to the brownout detection signal being asserted, and disable the multiplier (and the attenuation of the filtered audio signal) in response to the signal indicating that the filtered output is attenuated being asserted. In some examples, audio processor 102 may be a DSP, and brownout management circuitry 110 may be digital circuitry that is external to the DSP.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An audio amplification system, comprising:
   distributed brownout protection circuitry, comprising:
      audio processing circuitry comprising:
         audio volume control circuitry; and
         audio sample interpolation circuitry; and
      brownout management circuitry comprising:
         brownout detection circuitry configured to:
            determine whether the voltage of a battery that powers the audio amplification system is below a brownout threshold; and
            generate a brownout detection signal that indicates the voltage is below the brownout threshold; and
         brownout response circuitry coupled to an audio output of the audio sample interpolation circuitry, the brownout response circuitry configured to attenuate the audio samples output by the audio sample interpolation circuitry responsive to the brownout detection signal indicating that the voltage is below the brownout threshold;
         wherein the brownout response circuitry comprises:
      a multiplier configured to multiply the audio samples output by the audio sample interpolation circuitry by an attenuation value; and
      a multiplexer configured to:
         select output of the multiplier as output of the brownout response circuitry responsive to the brownout detection signal indicating that the voltage is below the brownout threshold; and
         select the audio samples output by the audio sample interpolation circuitry as output of the brownout response circuitry responsive to the brownout detection signal indicating that the voltage is above the brownout threshold.

2. The audio amplification system of claim 1, further comprising a power amplifier configured to amplify output of the brownout response circuitry, wherein the brownout management circuitry is configured to reduce latency of attenuated samples to an output of the power amplifier to no more than 10 micro-seconds from voltage of the battery being below the brownout threshold.

3. The audio amplification system of claim 1, wherein the brownout detection circuitry is coupled to the audio volume control circuitry, and the audio volume control circuitry is configured to attenuate the audio samples received by the volume control circuitry responsive to the brownout detection signal indicating that the voltage is below the brownout threshold.

4. The audio amplification system of claim 1, wherein the brownout response circuitry is configured to notify the audio processing circuitry, responsive to the brownout detection signal indicating that the voltage is below the brownout threshold, of an amount of attenuation to be applied to the audio samples by the brownout response circuitry.

5. The audio amplification system of claim 1, wherein:
   the audio processing circuitry is configured to:
      determine whether the audio samples output by the audio sample interpolation circuitry have been attenuated responsive to the brownout detection signal; and
      generate a control signal indicating that the audio samples output by the audio sample interpolation circuitry have been attenuated responsive to the brownout detection signal.

6. The audio amplification system of claim 5, wherein the brownout response circuitry is configured to, responsive to receipt of the control signal:
   route the audio samples received from the audio processing circuitry to the audio output of the brownout response circuitry; and
   disable attenuation of the audio samples received from the audio processing circuitry by the brownout response circuitry.

7. An audio processing system, comprising:
   a processor configured to:
      control magnitude of audio samples; and
      apply a digital filter to the audio samples; and
   brownout management circuitry comprising:
      brownout detection circuitry configured to:
         determine whether a voltage of a power source that powers the audio processing system is below a brownout threshold; and
         generate a brownout detection signal that indicates the voltage is below the brownout threshold; and
      brownout response circuitry coupled to an audio output of the processor, the brownout response circuitry configured to attenuate the audio samples output by the processor responsive to the brownout detection signal indicating that the voltage is below the brownout threshold;
      wherein the brownout response circuitry comprises:
         a multiplier configured to multiply the audio samples output by the processor by an attenuation value;
         a multiplexer configured to:
      select output of the multiplier as output of the brownout response circuitry responsive to the brownout detection signal indicating that the voltage is below the brownout threshold; and
      select the audio samples output by the processor as output of the brownout response circuitry responsive to the brownout detection signal indicating that the voltage is above the brownout threshold.

8. The system of claim 7, further comprising a power amplifier configured to amplify output of the brownout response circuitry, wherein the brownout management circuitry is configured to reduce latency of attenuated samples to an output of the power amplifier to no more than 10 micro-seconds from voltage of the power source below the brownout threshold.

9. The system of claim 7, wherein the brownout detection circuitry is coupled to the processor, and the processor is configured to reduce the magnitude of the audio samples received by the processor responsive to the brownout detection signal indicating that the voltage is below the brownout threshold.

10. The system of claim 7, wherein the brownout response circuitry is configured to notify the processor, responsive to the brownout detection signal indicating that the voltage is below the brownout threshold, of an amount of attenuation to be applied to the audio samples by the brownout response circuitry.

11. The system of claim 7, wherein:
the processor is configured to provide to the brownout response circuitry a control signal indicating that audio samples received from the processor are attenuated responsive to the brownout detection signal; and
the brownout response circuitry is configured to, responsive to receipt of the control signal:
route the audio samples received from the processor to the audio output of the brownout response circuitry; and
disable attenuation of the audio samples received from the processor by the brownout response circuitry.

* * * * *